(12) United States Patent  (10) Patent No.: US 8,587,105 B2
Nakao et al.  (45) Date of Patent: Nov. 19, 2013

(54) SEMICONDUCTOR DEVICE

(75) Inventors: Junichi Nakao, Hyogo-ken (JP);
Hiroshi Fukuyoshi, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,345

(22) Filed: Mar. 19, 2012

(65) Prior Publication Data

US 2013/0069215 A1 Mar. 21, 2013

(30) Foreign Application Priority Data

Sep. 21, 2011 (JP) ................................ 2011-206313

(51) Int. Cl.
*H01L 23/22* (2006.01)
(52) U.S. Cl.
USPC ........... 257/678; 257/687; 257/700; 257/706; 257/723; 257/E23.001; 257/E23.051; 257/E23.101; 257/E23.14
(58) Field of Classification Search
USPC .................. 257/678–733, 787–796, 257/E23.011–E23.194, E21.499–E21.519, 257/E23.009, E23.001; 438/15, 26, 51, 55, 438/64, 106, 124–127
See application file for complete search history.

(56) References Cited

U.S. PATENT DOCUMENTS

| | | | |
|---|---|---|---|
| 6,215,185 B1 * | 4/2001 | Kikuchi et al. | ................ 257/747 |
| 7,768,109 B2 | 8/2010 | Nakao | |
| 7,928,587 B2 * | 4/2011 | Tamba et al. | ................ 257/784 |
| 2011/0069458 A1 | 3/2011 | Nakao et al. | |

FOREIGN PATENT DOCUMENTS

| | | |
|---|---|---|
| JP | 04-083367 | 3/1992 |
| JP | 2004-088022 | 3/2004 |
| JP | 2007-109880 | 4/2007 |
| JP | 2011-066255 | 3/2011 |

* cited by examiner

*Primary Examiner* — Jasmine Clark
(74) *Attorney, Agent, or Firm* — Patterson & Sheridan, LLP

(57) ABSTRACT

A semiconductor device includes a first semiconductor chip, a buffer body, and a terminal lead. The first semiconductor chip includes a first electrode and a second electrode provided on a side opposite to the first electrode. The first semiconductor chip is configured to allow a current to flow between the first electrode and the second electrode. The buffer body includes a lower metal foil, a ceramic piece, and an upper metal foil. The lower metal foil is electrically connected to the second electrode. The ceramic piece is provided on the second electrode with the lower metal foil interposed. The upper metal foil is provided on a side of the ceramic piece opposite to the lower metal foil to be electrically connected to the lower metal foil. The terminal lead has one end provided on the upper metal foil and electrically connected to the upper metal foil.

15 Claims, 3 Drawing Sheets

SEMICONDUCTOR DEVICE

CROSS-REFERENCE TO RELATED APPLICATION

This application is based upon and claims the benefit of priority from the prior Japanese Patent Application No. 2011-206313, filed on Sep. 21, 2011; the entire contents of which are incorporated herein by reference.

FIELD

Embodiments described herein relate generally to a semiconductor device.

BACKGROUND

In a semiconductor device such as a power module used in an inverter and the like, an IGBT (Insulated Gate Bipolar Transistor) and a freewheeling diode are connected in anti-parallel and provided on a ceramic substrate having a surface in which an interconnect pattern is provided. The electrodes on the surfaces of the semiconductor chips such as the IGBT, the diode, etc., are drawn out to the interconnect pattern on the ceramic substrate by bonding wires, metal pieces having rectangular configurations, and the like (hereinbelow called draw-out leads) and are subsequently drawn out of the package from the interconnect pattern by external draw-out terminals. The electrodes of the semiconductor chip surfaces are electrically connected to the draw-out leads by solder. In recent years, characteristics of semiconductor chips are being improved and the semiconductor chips are being downsized. In particular, the downsizing of freewheeling diodes is progressing as the freewheeling diodes are formed of SiC (silicon carbide) instead of Si (silicon). As the semiconductor chips are downsized, the current density increases and the amount of generated heat from the semiconductor chip increases. Due to the increase of the amount of heat generated, the swing of the temperature cycles due to the on/off switching of the semiconductor chip increases. Such temperature cycles cause cycles of stress occurring due to the coefficient of thermal expansion difference between the semiconductor chip and the draw-out leads; and metal fatigue occurs in the solder. As a result, operation errors occur in the semiconductor chip. It is desirable for a semiconductor device to have high reliability with respect to temperature cycles even when operating at a high current density.

DETAILED DESCRIPTION

Figure 1A:
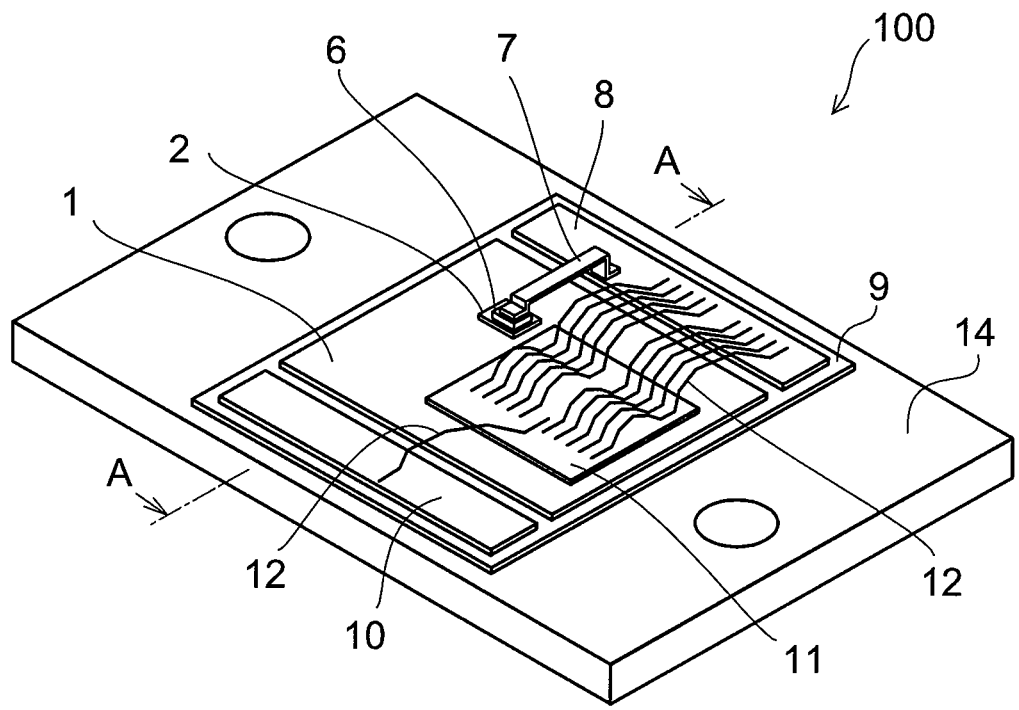
FIG. 1A is a perspective view schematically illustrating the main components of the semiconductor device according to the first embodiment.

A semiconductor device includes a first semiconductor chip, a buffer body, and a terminal lead. The first semiconductor chip includes a first electrode and a second electrode provided on a side opposite to the first electrode. The first semiconductor chip is configured to allow a current to flow between the first electrode and the second electrode. The buffer body includes a lower metal foil, a ceramic piece, and an upper metal foil. The lower metal foil is electrically connected to the second electrode. The ceramic piece is provided on the second electrode with the lower metal foil interposed. The upper metal foil is provided on a side of the ceramic piece opposite to the lower metal foil to be electrically connected to the lower metal foil. The terminal lead has one end provided on the upper metal foil and electrically connected to the upper metal foil.

Embodiments of the invention will now be described with reference to the drawings. The drawings used in the description of the examples are schematic for ease of description. In the actual implementation, the configurations, the dimensions, the size relationships, and the like of the components of the drawings are not always as illustrated in the drawings and are modifiable as appropriate within ranges in which the effects of the invention are obtainable.

First Embodiment

Figure 1B:
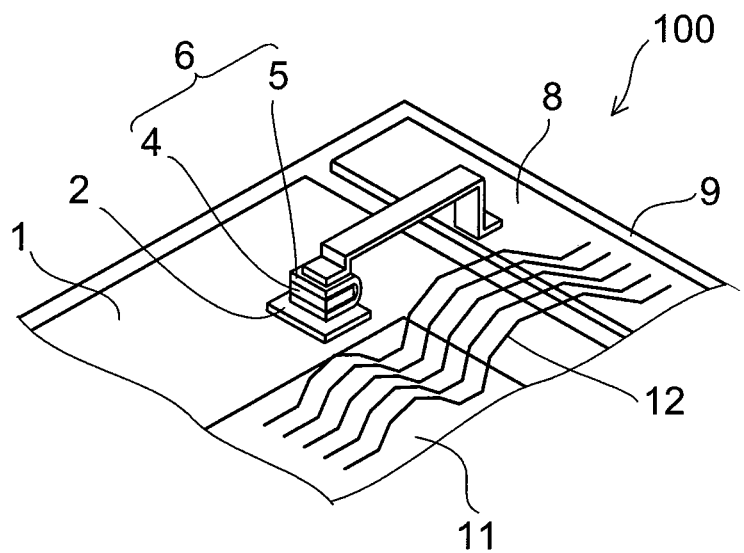
FIG. 1B is an enlarged perspective view schematically illustrating the periphery of a FRD (Fast Recovery Diode) 2 used as a freewheeling diode in FIG. 1A.
Figure 2:
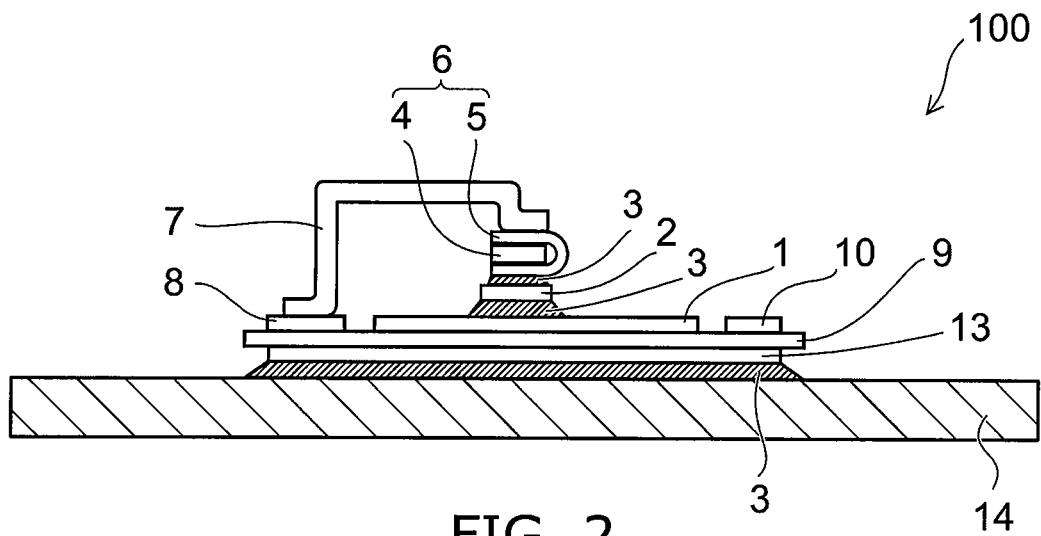
FIG. 2 is a cross-sectional view of line A-A of FIG. 1A.
Figure 3:
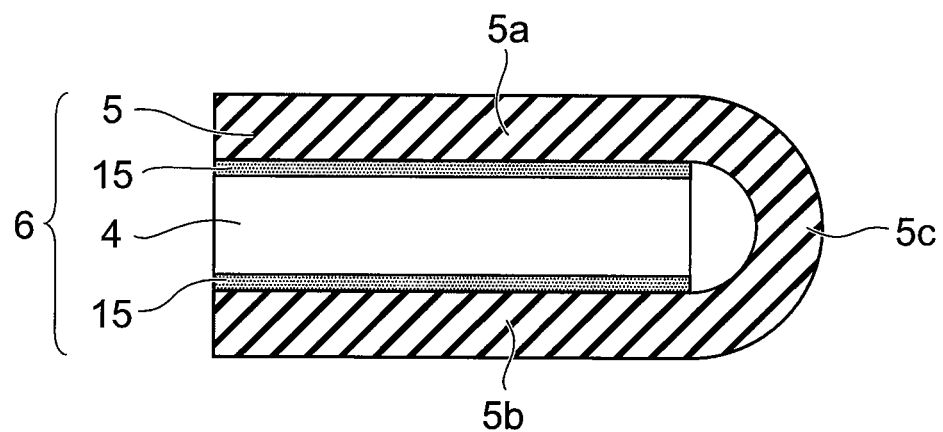
FIG. 3 is an enlarged cross-sectional view illustrating a buffer body 6 of the cross-sectional view of FIG. 2.

A semiconductor device according to a first embodiment will now be described using FIG. 1A to FIG. 3. FIG. 1A is a perspective view schematically illustrating the main components of the semiconductor device 100 according to the first embodiment; and FIG. 1B is an enlarged perspective view schematically illustrating the periphery of a FRD (Fast Recovery Diode) 2 used as a freewheeling diode. FIG. 2 is a cross-sectional view of line A-A of FIG. 1A. FIG. 3 is an enlarged cross-sectional view illustrating a buffer body 6 of the cross-sectional view of FIG. 2.

As illustrated in FIG. 1A to FIG. 3, the semiconductor device according to the first embodiment includes a metal heat dissipation plate 14, a ceramic substrate 9, the FRD chip (mainly a first semiconductor chip) 2, an IGBT (Insulated Gate Bipolar Transistor) chip (the first semiconductor chip or a second semiconductor chip) 11, the buffer body 6, a terminal lead 7, and bonding wires 12. As an example of the embodiment, the freewheeling diode 2 is connected in anti-parallel between the emitter-collector of the IGBT chip 11 in the semiconductor device 100 according to the first embodiment. Although a FRD chip is used as an example of the freewheeling diode chip 2, a SBD (the Schottky Barrier Diode) chip may be used. Instead of the IGBT chip 11, the chip of a semiconductor element such as a MOSFET (Metal Oxide Semiconductor Field Effect Transistor), an IEGT (Injection Enhanced Gate Transistor), etc., may be used in which the gate electrode controls the current flowing between the first and second electrodes.

The ceramic substrate 9 is made of ceramic; and, for example, a collector pattern (a first interconnect pattern) 1, an emitter pattern (a second interconnect pattern) 8, and a gate pattern (a third interconnect pattern) 10 are provided in one surface of the ceramic substrate 9 as circuit interconnects. As an example, these interconnect patterns may be copper (Cu) foils (thin plates of copper) having thicknesses of about 0.3 mm. The thicknesses and the pattern configurations are designed according to the applications of the circuit interconnects. Other than the copper foil, for example, another metal foil such as an aluminum (Al) foil, etc., may be used. For example, the collector pattern 1, the emitter pattern 8, and the gate pattern 10 are fixed to the one surface of the ceramic substrate recited above by silver solder. It is favorable for the ceramic substrate 9 to have high thermal conductivity, highly insulative properties, and a small coefficient of thermal expansion.

The ceramic substrate 9 further includes a copper foil 13 on the surface of the ceramic substrate 9 on the side opposite to the surface where the collector pattern 1, the emitter pattern 8, and the gate pattern 10 recited above are provided. The copper foil 13 also may be another metal foil such as an aluminum foil, etc. The ceramic substrate 9 is fixed onto one surface of the metal heat dissipation plate 14 via the copper foil 13 and solder 3.

The IGBT chip 11 includes a collector electrode (a first electrode or a third electrode) on the lower surface of the IGBT chip 11, an emitter electrode (a second electrode or a fourth electrode) on the upper surface of the IGBT chip 11 which is on the side opposite to the lower surface, and a gate electrode (a control electrode or a fifth electrode); and in the on-state, a current flows from the collector electrode toward the emitter electrode (details of the electrodes are not illustrated). This current is controlled by the gate electrode. The IGBT chip 11 is provided on the collector pattern 1 on the ceramic substrate 9 with the collector electrode interposed. For example, the collector electrode is electrically connected to the collector pattern 1 via solder (not illustrated).

The emitter electrode of the IGBT chip 11 is electrically connected to the emitter pattern 8 by the bonding wires 12. Although the bonding wires 12 include, for example, aluminum, another metal such as copper, etc., may be used. The bonding wires 12 are electrically connected to the emitter electrode and the emitter pattern 8 by solder or ultrasonic bonding. Multiple bonding wires 12 are used. By using the multiple bonding wires 12, the cross-sectional area in which the current of the bonding wires 12 flows can be increased and the density of the current flowing in the bonding wires 12 can be reduced.

Similarly to the description recited above, the gate electrode of the IGBT chip 11 is electrically connected to the gate pattern 10 by the bonding wire 12. Because the current flowing through the gate electrode is extremely small compared to the current flowing through the emitter electrode, one bonding wire 12 is sufficient.

Not-illustrated portions of the collector pattern 1, the emitter pattern 8, and the gate pattern 10 are connected respectively to a not-illustrated collector terminal, emitter terminal, and gate terminal by external draw-out terminals.

The FRD chip 2 includes a cathode electrode (a first electrode) on the lower surface of the FRD chip 2 and an anode electrode (a second electrode) on the upper surface of the FRD chip 2 which is on the side opposite to the lower surface (details of the electrodes are not illustrated). The FRD chip 2 includes silicon nitride (SiC). Thereby, the chip surface area of the FRD chip 2 can be reduced because this FRD chip has a lower resistance than the case where the FRD chip is formed of Si. The surface area of the FRD chip 2 according to this embodiment is 4.0 mm by 4.0 mm.

The FRD chip 2 is provided on the collector pattern 1 via the cathode electrode. The cathode electrode is electrically connected to the collector pattern 1 via, for example, solder (not illustrated). The anode electrode is electrically connected to the terminal lead 7 via the buffer body 6.

The buffer body 6 is made of a ceramic piece 4 and an metal foil 5 that is provided on and under the ceramic piece 4 and is connected with the ceramic piece 4. In other words, the buffer body 6 includes: a lower metal foil 5b electrically connected to the anode electrode of the FRD chip 2; the ceramic piece 4 provided on the anode electrode with the lower metal foil 5b interposed; and an upper metal foil 5a provided on the side of the ceramic piece 4 opposite to the lower metal foil 5b and electrically connected to the lower metal foil 5b. The lower metal foil 5b and the upper metal foil 5a are electrically connected by a connecting conductor 5c. The lower metal foil 5b of the buffer body 6 is electrically connected to the anode electrode of the FRD chip 2 by the solder 3. The ceramic used as the ceramic piece 4 has a coefficient of thermal expansion that is near the coefficients of thermal expansion of silicon nitride or silicon and smaller than those of the metals such as copper, aluminum, etc., which are used as the terminal leads. For example, $Al_2O_3$ (alumina), AlN (aluminum nitride), BN (boron nitride), SiN (silicon nitride), or the like may be used. The thickness of the ceramic piece 4 is, for example, 0.32 mm.

In the semiconductor device 100 according to this embodiment, the connecting conductor 5c electrically connects the lower metal foil 5b to the upper metal foil 5a at the side end portion of the ceramic piece 4. The connecting conductor 5c, the lower metal foil 5b, and the upper metal foil 5a are formed integrally from the same material. For example, the metal foil 5 that includes the connecting conductor 5c, the lower metal foil 5b, and the upper metal foil 5a as a single body may be formed from, for example, one copper foil having a thickness of 0.3 mm by bending into a U-shaped configuration or using a die to form into the U-shaped configuration. Other than copper, the metal foil 5 also may be another metal such as aluminum, etc. The lower metal foil 5b and the upper metal foil 5a are bonded to the ceramic substrate by, for example, silver solder 15.

One end of the terminal lead 7 is electrically connected to the upper metal foil 5a of the buffer body 6. One other end of the terminal lead 7 is electrically connected to the emitter pattern 8. The terminal lead 7 is made of a metal piece having a band configuration or a rectangular configuration and, in the case of this embodiment, is a copper piece having a width of 2.5 mm and a thickness of 0.4 mm. The two ends of the terminal lead 7 (the one end and the one other end described above) are bent in the longitudinal direction to be further on the ceramic substrate 1 side than is the portion of the terminal lead 7 other than the two ends. Other than copper, the terminal lead 7 may include another metal such as Al, etc.; and the width and the thickness of the terminal lead 7 are set according to the amount of the current that flows. The terminal lead 7 may be electrically connected to the emitter pattern 8 and the upper metal foil 5a of the buffer body 6 by solder or ultrasonic bonding.

Thus configured, the semiconductor device 100 according to this embodiment has the following features. The FRD chip 2 functions as a freewheeling diode that allows a loop current occurring due to the inductance component of the load to flow inside the semiconductor device 100. In the case where the semiconductor device 100 is used in an inverter circuit for driving a motor, the loop current flowing in the freewheeling diode is a large current exceeding 50 A. In the case where such a large current flows in the FRD chip 2, the FRD chip 2 generates heat.

Here, the case where the terminal lead 7 is directly connected to the FRD chip 2 via solder will be considered as a comparative example. In the case of this comparative example, thermal expansion of the FRD chip 2 and the terminal lead 7 connected to the FRD chip 2 via the solder 3 occurs due to the heat generation. When the loop current attenuates and vanishes, the FRD chip 2 and the terminal lead 7 contract due to heat dissipation. The difference between the coefficient of thermal expansion of the Si or the SiC of the FRD chip and the coefficient of thermal expansion of the copper or the aluminum of the terminal lead is large enough to cause the following effects. Because the difference between the two coefficients of thermal expansion is large, the thermal expansion recited above and the contraction recited above cause a large stress to be applied to the solder 3 that bonds the FRD chip to the terminal lead. Temperature cycles occur when the semiconductor device is repeatedly switched between the on-state and the off-state. Such temperature cycles cause cycles of stress to occur; metal fatigue of the solder 3 that bonds the FRD chip 2 to the terminal lead 7 occurs; and the solder 3 degrades. As a result, by undergoing the temperature cycles, characteristic failures such as those causing conduction defects and the like occur in the semiconductor device.

However, the semiconductor device 100 according to this embodiment differs from the comparative example recited above in that the semiconductor device 100 includes the buffer body 6 between the FRD chip 2 and the terminal lead 7. The buffer body 6 has a structure in which the lower metal foil 5b and the upper metal foil 5a are provided under and on the ceramic piece 4. In the case where the lower metal foil 5b and the upper metal foil 5a are affixed to the ceramic piece 4 using a bonding agent such as silver solder, etc., and the ceramic piece 4 has a thickness not less than 0.2 mm, the coefficient of thermal expansion of the buffer body 6 empirically can be considered to be substantially the coefficient of thermal expansion of the ceramic piece 4. Because the ceramic piece 4 is formed of $Al_2O_3$, AlN, BN, or SiN which have coefficients of thermal expansion that are extremely near those of Si or SiC, the coefficient of thermal expansion of the buffer body 6 can be considered to be substantially equal to the coefficient of thermal expansion of the FRD chip 2.

As a result, the occurrence of the stress due to the differences of the coefficients of thermal expansion at the bonding portions of the FRD chip 2, the buffer body 6, and the terminal lead 7 is suppressed. Even in the case where the temperature cycles occur, the degradation of the solder 3 that bonds the FRD chip 2 to the buffer body 6 is suppressed. When the buffer body 6 and the terminal lead 7 are bonded by ultrasonic bonding, bonding defects due to the temperature cycles do not occur easily. Even in the case where the terminal lead 7 and the FRD chip 2 are bonded by solder, in this embodiment, the heat generation of the FRD chip 2 substantially does not affect the bond between the terminal lead 7 and the buffer body 6 because the buffer body 6 exists between the terminal lead 7 and the FRD chip 2.

As described above, because the semiconductor device 100 according to this embodiment includes the buffer body 6 between the FRD chip 2 and the terminal lead 7, the occurrence of conduction defects is suppressed even in the case where the temperature cycles occur; and the reliability increases.

Second Embodiment

Figure 4:
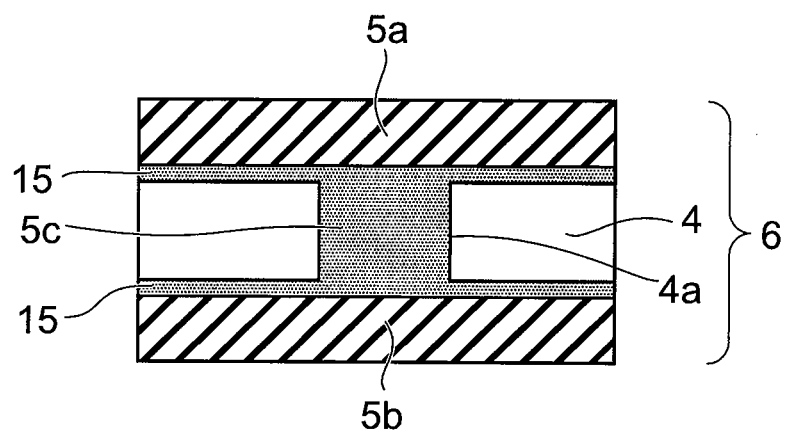
FIG. 4 is an enlarged cross-sectional view of the buffer body of the semiconductor device according to the second embodiment and is a cross-sectional view corresponding to FIG. 3.

A semiconductor device according to a second embodiment will now be described using FIG. 4. FIG. 4 is an enlarged cross-sectional view of the buffer body of the semiconductor device 200 according to this embodiment and is a cross-sectional view corresponding to FIG. 3. The same reference numeral or symbol is used for portions having the same configurations as the configurations described in the first embodiment, and a description of such portions is omitted. Points that differ from the first embodiment are mainly described.

FIG. 4 is a cross-sectional view of the buffer body 6 of the semiconductor device 200 according to this embodiment; and the structure of the buffer body 6 differs from that of the semiconductor device 100 according to the first embodiment. In the semiconductor device 200 according to this embodiment, the connecting conductor 5c is provided in a hole 4a piercing the ceramic piece 4. The connecting conductor 5c includes, for example, the silver solder 15. As an example of the manufacturing processes, the silver solder 15 is provided on the entire surfaces of the upper surface and the lower surface of the ceramic piece 4; and the lower metal foil 5b and the upper metal foil 5a are bonded to the lower surface and the upper surface of the ceramic piece 4 respectively via the silver solder. Thereby, the silver solder 15 that is between the ceramic piece 4 and the lower metal foil 5b and between the ceramic piece 4 and the upper metal foil 5a is filled to enter the hole 4a of the ceramic piece 4. As a result, the connecting conductor 5c is formed of the silver solder 15 filled into the hole 4a piercing the ceramic piece 4. The lower metal foil 5b and the upper metal foil 5a are electrically connected by the connecting conductor 5c.

In the semiconductor device 200 according to this embodiment, similarly to the semiconductor device 100 according to the first embodiment, the occurrence of conduction defects is suppressed even in the case where the temperature cycles occur, because the semiconductor device 200 includes the buffer body 6 which is provided between the FRD chip 2 and the terminal lead 7 and includes the ceramic piece 4 having a coefficient of thermal expansion substantially equal to the coefficient of thermal expansion of the FRD chip 2. Then, the reliability of the semiconductor device 200 increases.

Third Embodiment

Figure 5:
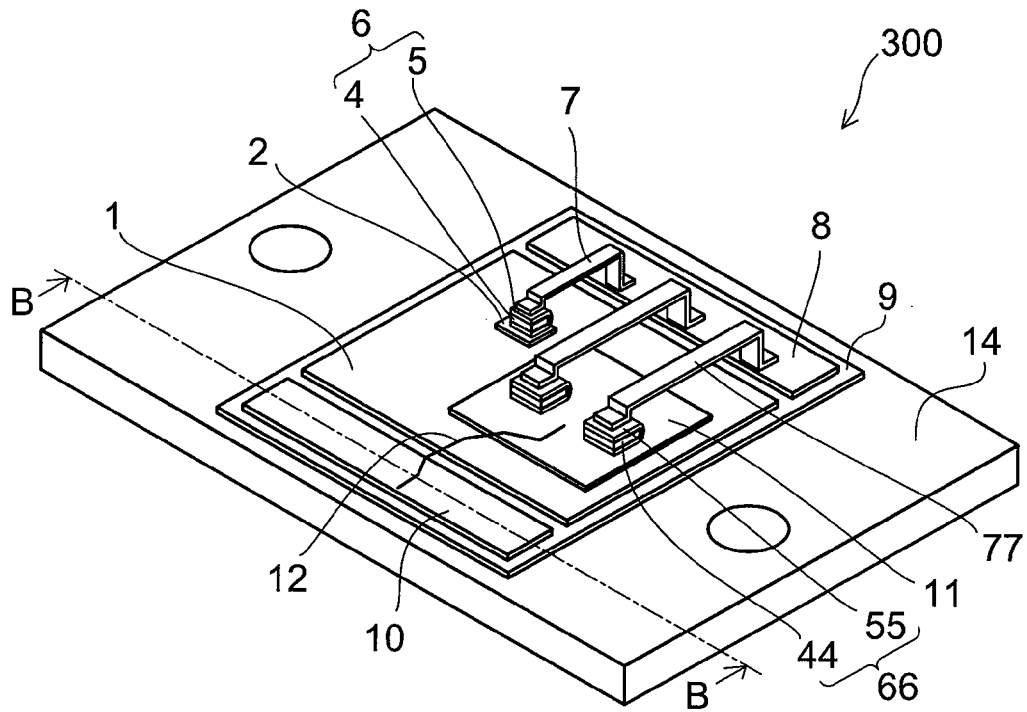
FIG. 5 is a perspective view schematically illustrating the semiconductor device according to the third embodiment.
Figure 6:
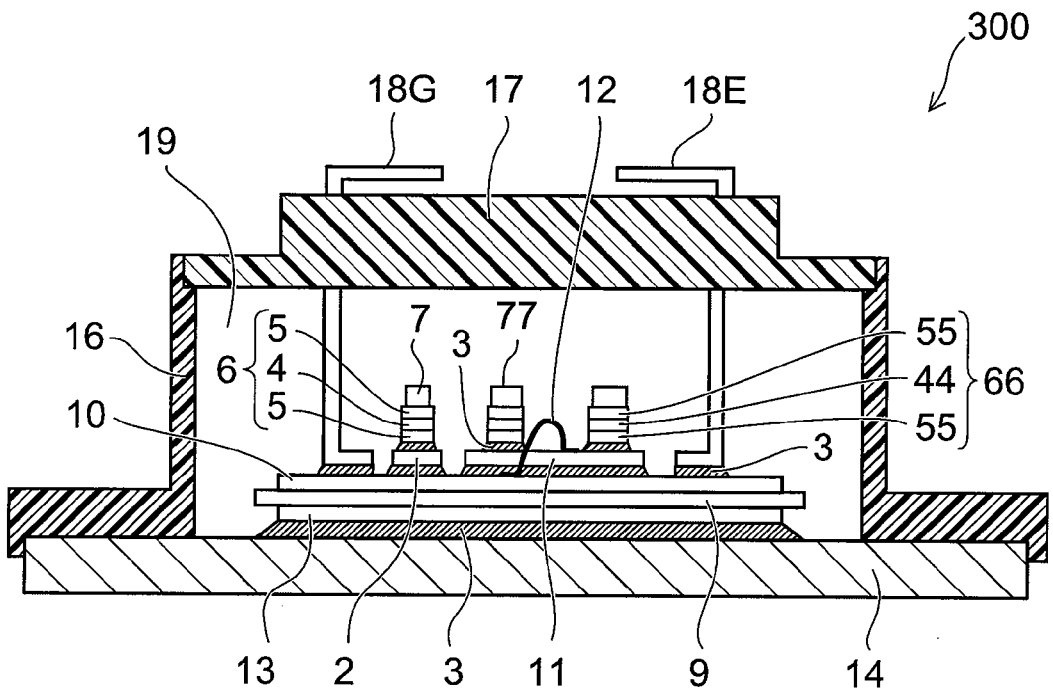
FIG. 6 is a schematic cross-sectional view along line B-B of FIG. 5.

A semiconductor device according to a third embodiment will now be described using FIG. 5 and FIG. 6. FIG. 5 is a perspective view schematically illustrating the semiconductor device 300 according to this embodiment. FIG. 6 is a schematic cross-sectional view along line B-B of FIG. 5. The same reference numeral or symbol is used for portions having the same configurations as the configurations described in the first embodiment, and a description of such portions is omitted. Points that differ from the first embodiment are mainly described.

As illustrated in FIG. 5 and FIG. 6, the semiconductor device 300 according to this embodiment differs from the semiconductor device 100 according to the first embodiment in that two terminal leads 77 are used to connect the emitter pattern 8 and the emitter electrode of the IGBT chip 11 instead of the multiple bonding wires 12 used in the first embodiment. In the semiconductor device 300 according to this embodiment, the emitter pattern 8 and the emitter electrode of the IGBT chip 11 (the second semiconductor chip) are electrically connected by the two terminal leads 77 similarly to the FRD chip 2 (the first semiconductor chip) and the emitter pattern 8 (the second interconnect pattern) being electrically connected by the terminal lead 7.

In other words, the emitter electrode of the IGBT chip 11 is electrically connected via buffer body 66 to each of the two terminal leads 77. The structures of the buffer bodies 66 and the structures of the terminal leads 77 connecting the emitter electrode of the IGBT chip 11 to the emitter pattern 8 are exactly the same as the structure of the buffer body 6 and the structure of the terminal lead 7 connecting the anode electrode of the FRD chip 2 to the emitter pattern 8. However, the dimensions of the buffer bodies 6 and the terminal leads 7 are set to correspond to the specifications of the chips.

The package structure of the semiconductor device 300 according to this embodiment is more specific than that of the semiconductor device 100 according to the first embodiment. The semiconductor device 300 further includes a resin case 16, a resin lid 17, a first external draw-out terminal, a second external draw-out terminal, a third external draw-out terminal, and a silicone gel 19.

The resin case 16 has an annular structure around the ceramic substrate 9 on the surface of the metal heat dissipation plate 14 on which the ceramic substrate 9 is mounted. The resin case 16 includes, for example, a resin such as PPS (Poly Phenylene Sulfide), PBT (Poly Butylene Terephthalate), etc. The resin case 16 has an opening having an annular structure at the upper portion on the side opposite to the metal heat dissipation plate 14. The resin lid 17 is provided on the opening and includes the first external draw-out terminal (not illustrated), the second external draw-out terminal 18E, and the third external draw-out terminal 18G that pierce the resin lid 17. These external draw-out terminals are fixed by the resin lid 17. The resin lid 17 includes the same resin material as the resin case 16.

One end of the first external draw-out terminal is electrically connected to the collector pattern 1 on the ceramic substrate 9. One other end of the first external draw-out terminal is connected to a collector terminal outside the resin lid 17. One end of the second external draw-out terminal 18E is electrically connected to the emitter pattern 8 on the ceramic substrate 9. One other end of the second external draw-out terminal 18E is electrically connected to an emitter terminal outside the resin lid 17. One end of the third external draw-out terminal 18G is electrically connected to the gate pattern 10. One other end of the third external draw-out terminal 18G is electrically connected to a gate terminal outside the resin lid 17.

The silicone gel 19 is filled into the interior around which the resin case 16, the resin lid 17, and the metal heat dissipation plate 14 are provided. The silicone gel 19 covers the FRD chip 2, the IGBT chip 11, the collector pattern 1, the emitter pattern 8, the gate pattern 10, the buffer bodies 6 and 66, and the terminal leads 7 and 77.

In the semiconductor device 300 according to this embodiment, similarly to the semiconductor device 100 according to the first embodiment, the occurrence of conduction defects is suppressed even in the case where the temperature cycles occur, because the semiconductor device 300 includes the buffer body 6 which is provided between the FRD chip 2 and the terminal lead 7 and includes the ceramic piece 4 having a coefficient of thermal expansion substantially equal to the coefficient of thermal expansion of the FRD chip 2. Then, the reliability of the semiconductor device 300 increases.

Further, similarly to the FRD chip 2, the IGBT chip 11 and the emitter pattern 8 are connected by the terminal leads 77 via the buffer bodies 66. The buffer body 66 which includes the ceramic piece 4 having the coefficient of thermal expansion substantially equal to the coefficient of thermal expansion of the IGBT chip 11 is also included between the IGBT chip 11 and the terminal lead 77. Thereby, in the IGBT chip 11 as well, the occurrence of conduction defects is suppressed even in the case where the temperature cycles occur; and the reliability increases.

The semiconductor devices 100 to 300 according to the embodiments described above have structures in which the IGBT chip 11 and the FRD chip 2 are bonded in anti-parallel. However, the effects of the invention are not limited thereto. For example, the invention is similarly applicable even in the case where the semiconductor device includes only the FRD chip 2 or only the IGBT chip 11. In other words, the reliability with respect to temperature cycles increases by the semiconductor device having a structure in which at least a semiconductor chip is electrically bonded to a terminal lead via a buffer body including a ceramic.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first semiconductor chip including a first electrode and a second electrode provided on a side opposite to the first electrode, the first semiconductor chip being configured to allow a current to flow between the first electrode and the second electrode;
a buffer body including a lower metal foil, a ceramic piece, and an upper metal foil, the lower metal foil being electrically connected to the second electrode, the ceramic piece being provided on the second electrode with the lower metal foil interposed, the upper metal foil being provided on a side of the ceramic piece opposite to the lower metal foil to be electrically connected to the lower metal foil; and
a terminal lead having one end provided on the upper metal foil and electrically connected to the upper metal foil.

2. The device according to claim 1, wherein the ceramic piece includes one selected from $Al_2O_3$, AlN, and SiN.

3. The device according to claim 1, wherein the lower metal foil and the upper metal foil are electrically connected by a connecting conductor.

4. The device according to claim 3, wherein:
the connecting conductor is provided at a side end portion of the ceramic piece; and
the lower metal foil, the upper metal foil, and the connecting conductor are formed integrally from the same metal.

5. The device according to claim 3, wherein the connecting conductor is provided in a hole piercing the ceramic piece.

6. The device according to claim 5, wherein the connecting conductor is silver solder.

7. The device according to claim 1, wherein the upper metal foil and the lower metal foil include copper or aluminum.

8. The device according to claim 1, wherein the second electrode and the lower metal foil are electrically connected by solder.

9. The device according to claim 1, wherein the first semiconductor chip is a diode.

10. The device according to claim 1, wherein the first semiconductor chip includes a control electrode on the side where the second electrode is provided, the control electrode being configured to control the current flowing between the first electrode and the second electrode.

11. The device according to claim 10, wherein the first semiconductor chip is one selected from a MOSFET and an IGBT.

12. The device according to claim 1, further comprising a ceramic substrate including a first interconnect pattern and a second interconnect pattern in one surface, the second interconnect pattern being provided apart from the first interconnect pattern,
- the first semiconductor chip being provided on the first interconnect pattern and electrically connected to the first interconnect pattern via the first electrode,
- one other end of the terminal lead on a side opposite to the one end being on the second interconnect pattern and electrically connected to the second interconnect pattern.

13. The device according to claim 12, further comprising a second semiconductor chip including a third electrode, a fourth electrode, and a fifth electrode, the fourth electrode being provided on a side opposite to the third electrode, the fifth electrode being on a surface of the second semiconductor chip on the fourth electrode side to control a current flowing between the third electrode and the fourth electrode,
- the ceramic substrate further including a third interconnect pattern provided in the one surface on a side of the first interconnect pattern opposite to the second interconnect pattern,
- the second semiconductor chip being provided on the first interconnect pattern and electrically connected to the first interconnect pattern via the third electrode,
- the fourth electrode of the second semiconductor chip being electrically connected to the second interconnect pattern,
- the fifth electrode of the second semiconductor chip being electrically connected to the third interconnect pattern.

14. The device according to claim 13, further comprising:
- a metal heat dissipation plate having the ceramic substrate mounted on a surface of the metal heat dissipation plate;
- a resin case having an annular structure around the ceramic substrate on the surface of the metal heat dissipation plate;
- a resin lid provided in an opening of the annular structure on a side of the resin case opposite to the metal heat dissipation plate;
- a first external draw-out terminal piercing the resin lid and fixed to the resin lid, the first external draw-out terminal being on the first interconnect pattern and electrically connected to the first interconnect pattern;
- a second external draw-out terminal piercing the resin lid and fixed to the resin lid, the second external draw-out terminal being on the second interconnect pattern and electrically connected to the second interconnect pattern;
- a third external draw-out terminal piercing the resin lid and fixed to the resin lid, the third external draw-out terminal being on the third interconnect pattern and electrically connected to the third interconnect pattern; and
- a silicone gel filled into the case to cover the first semiconductor chip and the second semiconductor chip.

15. The device according to claim 12, wherein:
the first electrode is a cathode electrode; and
the second electrode is an anode electrode.

* * * * *